United States Patent
Okabe et al.

(10) Patent No.: US 11,145,529 B2
(45) Date of Patent: Oct. 12, 2021

(54) EFEM AND METHOD OF INTRODUCING REPLACEMENT GAS THEREINTO

(71) Applicant: TDK CORPORATION, Tokyo (JP)

(72) Inventors: Tsutomu Okabe, Tokyo (JP); Hiroshi Igarashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 360 days.

(21) Appl. No.: 15/991,960

(22) Filed: May 29, 2018

(65) Prior Publication Data

US 2018/0350647 A1 Dec. 6, 2018

(30) Foreign Application Priority Data

May 31, 2017 (JP) .............................. JP2017-108662

(51) Int. Cl.
*H01L 21/67* (2006.01)
*H01L 21/677* (2006.01)
*H01L 21/673* (2006.01)

(52) U.S. Cl.
CPC .. *H01L 21/67772* (2013.01); *H01L 21/67017* (2013.01); *H01L 21/67389* (2013.01); *H01L 21/67742* (2013.01); *H01L 21/67778* (2013.01)

(58) Field of Classification Search
CPC ......... H01L 21/67772; H01L 21/67017; H01L 21/67389; H01L 21/67742; H01L 21/67778
See application file for complete search history.

(56) References Cited

U.S. PATENT DOCUMENTS

| 2004/0165973 | A1  | 8/2004  | Lee et al.                  |
|--------------|-----|---------|-----------------------------|
| 2011/0073040 | A1* | 3/2011  | Hashimoto ....... H01L 21/67017 118/728 |
| 2011/0116059 | A1* | 5/2011  | Katsura ............ H01L 21/67017 355/30 |
| 2014/0363258 | A1* | 12/2014 | Iwamoto .......... H01L 21/67772 414/217 |

(Continued)

FOREIGN PATENT DOCUMENTS

| JP | H07-161656 A | 6/1995 |
| JP | H08-335572 A | 12/1996 |

(Continued)

*Primary Examiner* — Saul Rodriguez
*Assistant Examiner* — Ashley K Romano
(74) *Attorney, Agent, or Firm* — Oliff PLC

(57) ABSTRACT

An EFEM includes first and second chambers, an airflow formation unit, a gas discharge port, and first and second nozzles. The first chamber introduces a replacement gas. The second chamber is connected with the first chamber via first and second communication sections. In the first communication section, a filter is disposed, and the replacement gas inflows from the first chamber. In the second communication section, the replacement gas outflows into the first chamber. The airflow formation unit produces a circulating airflow between the first and second chambers. The gas discharge port discharges an internal gas from the first or second chamber. The first nozzle discharges the replacement gas supplied from a replacement gas supply source into the first chamber through a first opening. The second nozzle discharges the replacement gas supplied from the source through a second opening.

3 Claims, 7 Drawing Sheets

(56) References Cited

U.S. PATENT DOCUMENTS

| | | | |
|---|---|---|---|
| 2015/0101482 A1* | 4/2015 | Chou | B08B 17/00 |
| | | | 95/12 |
| 2017/0125272 A1 | 5/2017 | van Gogh et al. | |
| 2018/0040493 A1 | 2/2018 | Kawai et al. | |
| 2018/0204753 A1* | 7/2018 | Kawai | H01L 21/67017 |

FOREIGN PATENT DOCUMENTS

| | | |
|---|---|---|
| JP | 2010-109250 A | 5/2010 |
| JP | 2014-038888 A | 2/2014 |
| JP | 2016-162818 A | 9/2016 |
| KR | 10-2004-0076432 A | 9/2004 |
| KR | 10-2017-0054226 A | 5/2017 |

\* cited by examiner

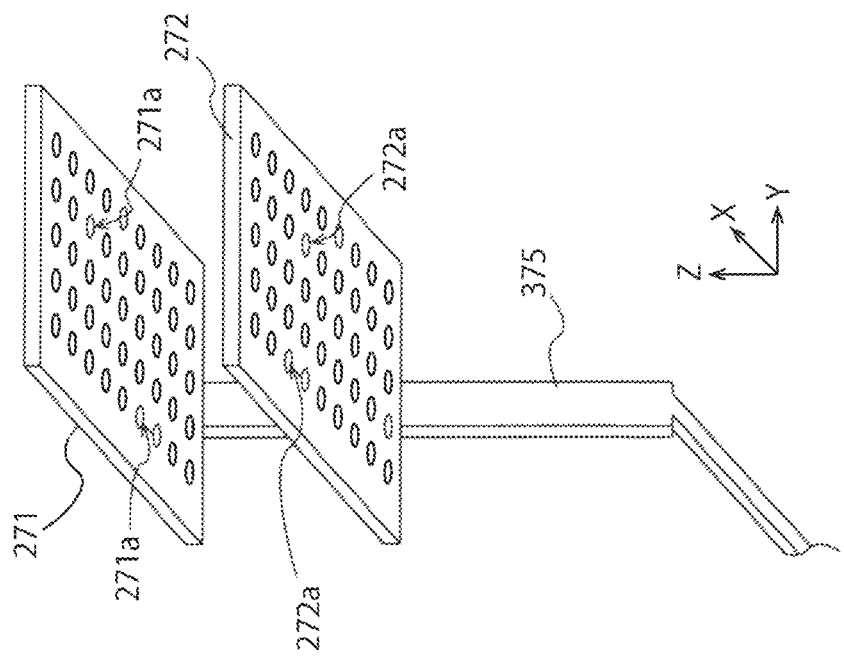
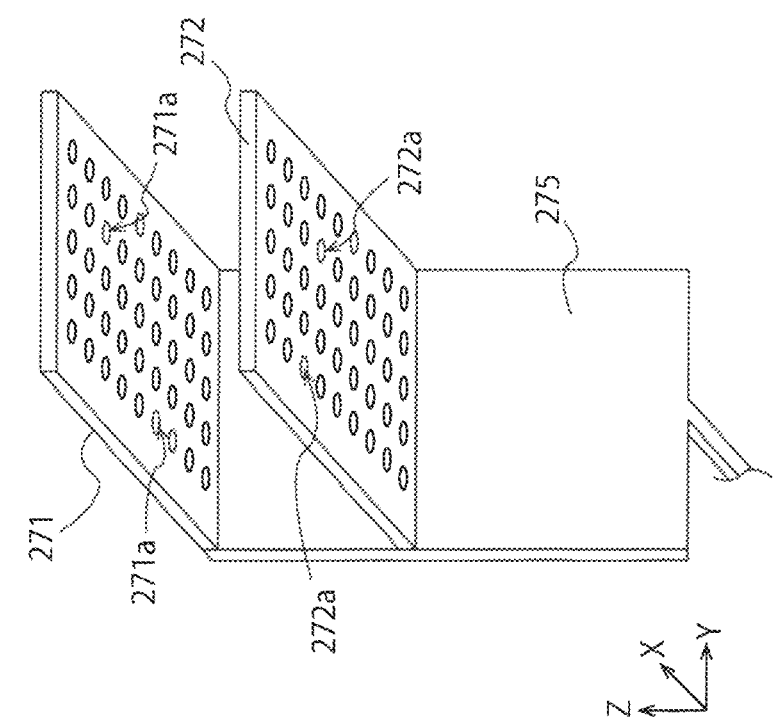

EFEM AND METHOD OF INTRODUCING REPLACEMENT GAS THERETO

BACKGROUND OF THE INVENTION

1. Field of the Invention

The present invention relates to an EFEM configured to transport wafers from a transportation container to a processing chamber in a semiconductor factory, and to a method of introducing a replacement gas into the EFEM.

2. Description of the Related Art

In a step of manufacturing semiconductors, wafers are transported among processing apparatuses using a wafer transportation container referred to as a FOUP, a FOSB, etc. When the wafers are transported from the wafer transportation container to the processing chamber, an Equipment Front End Module (EFEM) is used. The EFEM produces a clean space, which is called a minienvironment or so, that is cleaner than the space in a factory and transports the wafers between the wafer transportation container and the processing chamber via the clean space. Thus, an environment where the wafers are exposed is kept clean even when the wafers are being transported from the wafer transportation container to the processing chamber, and the wafers can be protected from oxidation or so (see Patent Document 1 etc.).

Proposed nowadays is a circulation-type EFEM where gas can circulate therein. In such a circulation-type EFEM, the consumption of gas can be reduced by circulating a replacement gas, such as nitrogen, in the circulation-type EFEM.

Patent Document 1: JP2010109250 (A)

SUMMARY OF THE INVENTION

In an EFEM where nitrogen is introduced, however, the nitrogen supplied from a supply section is unevenly present in the EFEM. In particular, if an air environment is needed in the EFEM for maintenance or so, the inside of the EFEM needs to be replaced with the nitrogen gas once again, but at this time, a concentration of nitrogen is hard to increase uniformly in such a conventional EFEM. In conventional EFEMs, it may thereby take a long time to increase a nitrogen gas concentration in the entire EFEM to a predetermined level, and a down time of apparatuses in a semiconductor factory may be long.

The present invention has been achieved under such circumstances. It is an object of the invention to provide an EFEM capable of increasing a concentration of a replacement gas in the EFEM more uniformly than before and to provide a method of introducing a replacement gas into the EFEM.

An EFEM according to the present invention comprises:
a first chamber configured to introduce a replacement gas;
a second chamber connected with a lower part of the first chamber via:
  a first communication section where a filter is disposed, and the replacement gas inflows from the first chamber at the time of formation of a circulating airflow; and
  a second communication section where the replacement gas outflows into the first chamber at the time of formation of the circulating airflow,
an airflow formation unit configured to produce the circulating airflow between the first chamber and the second chamber;
a gas discharge port configured to discharge an internal gas from the first chamber or the second chamber;
a first nozzle disposed in the first chamber, including a first opening formed intermittently or continuously in a first direction that is at least a horizontal direction, and configured to discharge the replacement gas supplied from a replacement gas supply source into the first chamber through the first opening; and
a second nozzle including a second opening formed intermittently or continuously in a parallel direction to the first direction and configured to discharge the replacement gas supplied from the replacement gas supply source through the second opening.

The EFEM according to the present invention comprises the first nozzle having the first opening and the second nozzle having the second opening formed in parallel to the first opening, and can emit the replacement gas from both of the first and second nozzles. Since the first and second openings are formed intermittently or continuously in a predetermined direction, the EFEM having the openings and the nozzles can arrange the openings configured to discharge the replacement gas in a wide range of the EFEM and can increase a concentration of the replacement gas in the first and second chambers of the EFEM more uniformly than before.

For example, the second nozzle may be disposed in the second chamber and emit the replacement gas into the second chamber.

Since the EFEM has not only the first nozzle configured to emit the replacement gas into the first chamber but the second nozzle configured to emit the replacement gas into the second chamber, a concentration of the replacement gas in the first and second chambers of the EFEM can increase more uniformly than before. In particular, the EFEM can increase a concentration of nitrogen gas in the second chamber more uniformly than before by effectively leading the replacement gas to the corners of the second chamber, where the airflow from the first communication section with the filter is hard to reach, using the second nozzle.

For example, the airflow formation unit may be disposed next to the filter in the first communication section, and the first nozzle disposed in the first chamber and the second nozzle disposed in the second chamber may be arranged so as to sandwich the airflow formation unit and the filter in the vertical direction.

In the EFEM, the nozzles of the replacement gas are arranged above and below the airflow formation unit and the filter, and the nitrogen gas can thereby directly be supplied from the nozzles into both of the first and second chambers. In the EFEM, a deviation of concentration of nitrogen gas caused by a ventilation resistance of the filter is thereby hard to occur, and a concentration of the nitrogen gas in the EFEM can increase more uniformly than before. In the EFEM, since the first and second nozzles sandwich the filter, the filter can be prevented from being contaminated.

For example, the second nozzle may be disposed at the same height as the first nozzle in the first chamber and emit the replacement gas into the first chamber.

Since the openings configured to emit the nitrogen gas are arranged horizontally in an areal manner, the EFEM has less space where the replacement gas from the nozzles is hard to reach, and a concentration of the nitrogen gas in the first and second chambers of the EFEM can increase more uniformly than before.

A method of introducing a replacement gas into the EFEM according to the present invention comprises:

a first emission step of emitting a replacement gas supplied from a replacement gas supply source into a first chamber through a first opening of a first nozzle disposed in the first chamber, wherein the first opening is formed intermittently or continuously in a first direction that is at least a horizontal direction;

a second emission step of emitting the replacement gas through a second opening of a second nozzle, wherein the second opening is formed intermittently or continuously in a parallel direction to the first direction;

a discharge step of discharging an internal gas from the first chamber or a second chamber, wherein the second chamber is connected with a lower part of the first chamber via:

a first communication section where a filter is disposed, and the replacement gas inflows from the first chamber at the time of formation of a circulating airflow; and a second communication section where the replacement gas outflows into the first chamber at the time of formation of the circulating airflow, and an airflow adjustment step of adjusting a driving of an airflow formation unit configured to produce the circulating airflow between the first chamber and the second chamber.

In the above-mentioned method according to the present invention, since the first emission step using the first nozzle and the second emission step using the second nozzle are carried out, the replacement gas is emitted from the openings arranged in a wide range of the EFEM, and a concentration of the nitrogen gas in the first and second chambers of the EFEM can increase more uniformly than before. In the above-mentioned method according to the present invention, the production efficiency can be improved by reducing the time for gas replacement of the EFEM and reducing a down time of apparatuses in a semiconductor factory.

For example, the first emission step and the second emission step may be carried out while the airflow formation unit is not being driven in the airflow adjustment step.

Since the replacement gas is introduced while the airflow formation unit is not being driven, the replacement gas introduced from the first and second nozzles can effectively discharge a dry air etc. used to exist in the EFEM before the introduction of the replacement gas. Moreover, the dry air etc. used to exist in the EFEM before the introduction of the replacement gas is prevented from being mixed with the replacement gas newly introduced and from becoming hard to be discharged, and the time for gas replacement of the EFEM can be reduced.

For example, the second nozzle may be disposed in the second chamber, and the replacement gas may be emitted into the second chamber in the second emission step.

In the above-mentioned method, the replacement gas is emitted not only into the first chamber but into the second chamber, and a concentration of the replacement gas in the first and second chambers of the EFEM can increase more uniformly than before. In the above-mentioned method, a concentration of nitrogen gas in the second chamber can increase more uniformly than before, in particular, by effectively leading the replacement gas to the corners of the second chamber, where the airflow from the first communication section with the filter is hard to reach, using the second nozzle.

BRIEF DESCRIPTION OF THE DRAWINGS

FIG. 3A and FIG. 3B are a schematic view showing first to fourth nozzles of an EFEM according to Second Embodiment.

DETAILED DESCRIPTION OF THE PREFERRED EMBODIMENT

Hereinafter, the present invention is described based on embodiments shown in the figures.

Figure 1:
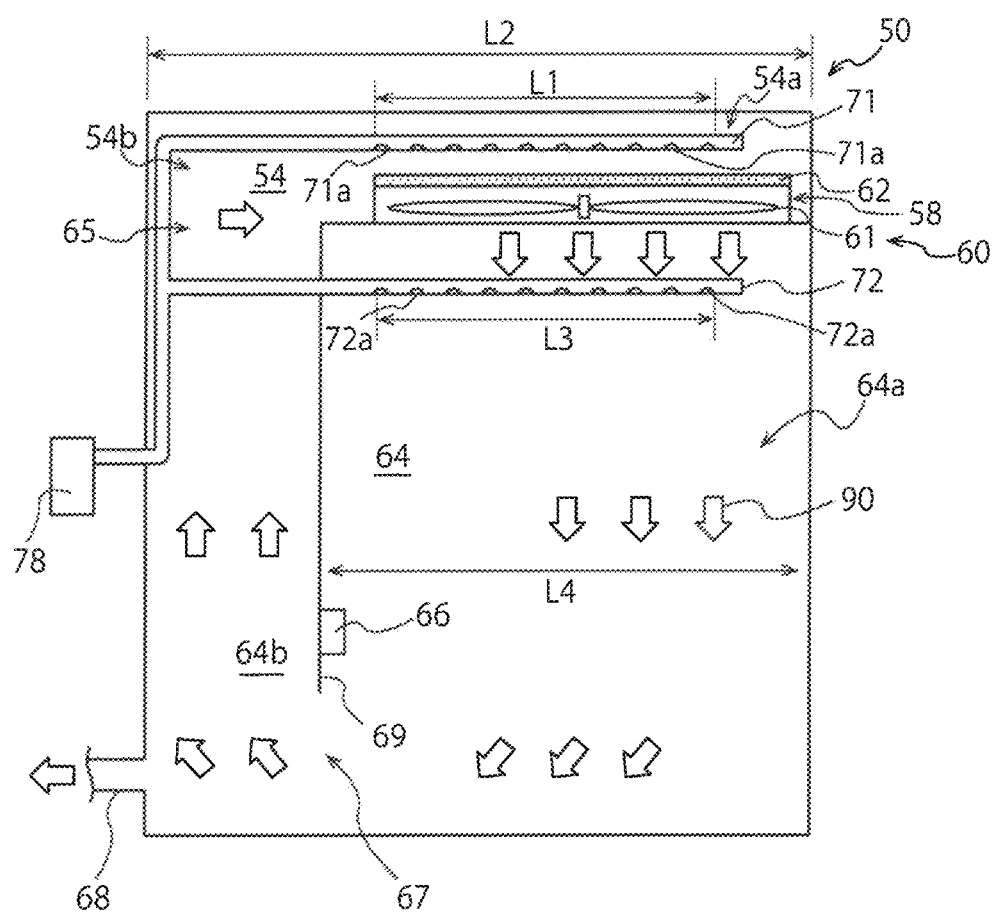
FIG. 1 a schematic view showing a flow of a replacement gas in an EFEM according to First Embodiment of the present invention.

FIG. 1 is a schematic view of an equipment front end module (EFEM) 50 according to First Embodiment of the present invention. The EFEM 50 is an apparatus used for delivering wafers between a FOUP (not shown), which is a wafer transportation container for transporting wafers, and a processing chamber (not shown), where the wafers are processed, in a semiconductor factory.

The EFEM 50 includes a second chamber 64 configured to produce a clean space called a minienvironment in the second chamber 64, and wafers housed in the FOUP are transported into the processing chamber via the second chamber 64.

The arrows 90 shown in FIG. 1 represent how a circulating airflow is formed in the EFEM 50 during the normal operation, where the wafers are being transported in the second chamber 64 of the EFEM 50. In the EFEM 50 according to the present embodiment, a nitrogen gas as a replacement gas is introduced into both a first chamber 54 disposed above the second chamber 64 (a second-story part if the second chamber 64 is considered to be a first-story part) and the second chamber 64 connected with a lower part of the first chamber 54. In the description of the EFEM 50, the Z-axis direction is a vertical direction, the X-axis direction is a direction that is perpendicular to the Z-axis and parallel to one of wall surfaces of the EFEM 50, and the Y-axis is a perpendicular direction to the Z-axis and the X-axis.

As shown in FIG. 1, two communication sections (first communication section 58 and second communication section 65) are arranged between the first chamber 54 and the second chamber 64 and connect the first chamber 54 and the second chamber 64.

In the normal operation state, the nitrogen gas introduced in the first chamber 54 and the second chamber 64 moves via the first communication section 58 and the second communication section 65 and produces a circulating airflow circulating between the first chamber 54 and the second chamber 64 as shown by the arrows 90 in FIG. 1. The wafers are transported between the FOUP and the processing chamber while the circulating airflow of the nitrogen gas is circulating in the first chamber 54 and the second chamber 64 as shown in FIG. 1.

In addition to the first chamber 54 and the second chamber 64, the EFEM 50 includes first to fourth nozzles 71 to 74, an airflow formation unit 60, a filter 62, a gas discharge port 68, an oxygen densitometer 66, and the like. Although not shown in FIG. 1, the EFEM 50 includes a transportation robot disposed in the second chamber 64 and configured to transport the wafers, a load port apparatus for connecting the FOUP and the second chamber 64, and the like.

As shown in FIG. 1, a nitrogen gas can directly be introduced into the first chamber 54 via the first and third nozzles 71 and 73 (see FIG. 2). Although not shown in FIG. 1, the first chamber 54 includes a dry air introduction nozzle configured to introduce a dry air. In the EFEM 50, a nitrogen gas can also directly be introduced into the second chamber 64 via the second and fourth nozzles 72 and 74.

Figure 2A:
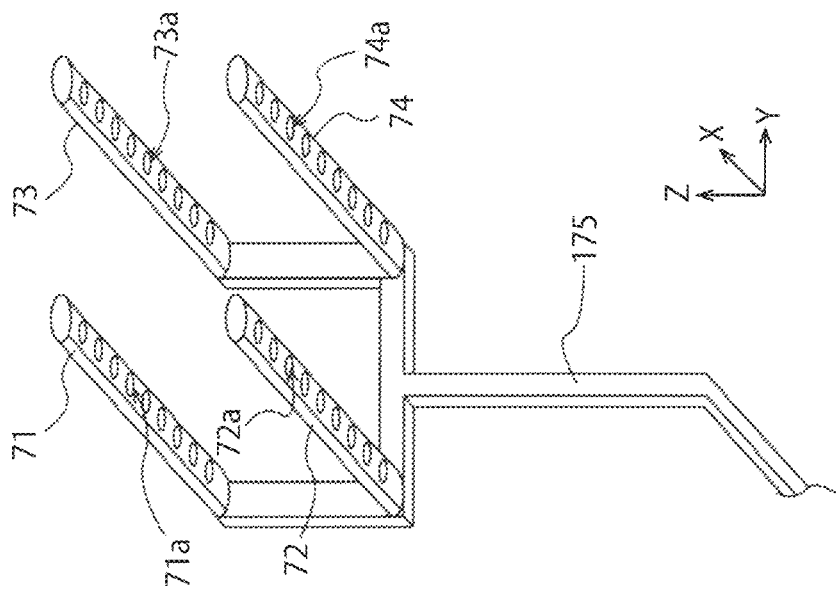
FIG. 2A is a schematic view showing first to fourth nozzles of the EFEM shown in FIG. 1.

FIG. 2A is a schematic view showing the first to fourth nozzles 71 to 74 of the EFEM 50 shown in FIG. 1. The first to fourth nozzles 71 to 74 are connected with a replacement gas supply source 78 (see FIG. 1) via a pipe 75, and a nitrogen gas is supplied to each of the first to fourth nozzles 71 to 74 via the pipe 75. For example, the replacement gas supply source 78 is formed by a nitrogen gas tank. The shape of the pipe 75 connecting between the replacement gas supply source 78 and the first to fourth nozzles 71 to 74 is not limited to a shape where the pipe 75 branches independently so as to connect with the first to fourth nozzles 71 to 74. The pipe of the present invention has any shape, such as a shape of a pipe 175, shown in FIG. 2B according to a variation of the pipe of the present invention, branching into a part connecting the second nozzle 72 and the first nozzle 71 and a part connecting the fourth nozzle 74 and the third nozzle 73. Incidentally, the replacement gas used in the EFEM 50 is not limited to the nitrogen gas used in the present embodiment, but may be an inert gas other than nitrogen gas, a reductive gas, or the like.

As shown in FIG. 1 and FIG. 2, the first nozzle 71 extends horizontally in a first direction (parallel direction to the X-axis in FIG. 1) and has a plurality of first openings 71a formed intermittently in the first direction. The first nozzle 71 emits a nitrogen gas supplied from the replacement gas supply source 78 from the first openings 71a arranged linearly in the first direction into the first chamber 54. The first openings 71a are open downward. The first nozzle 71 emits the nitrogen gas toward the first communication section 58 with the filter 62.

The first nozzle 71 has a length L1 where the first openings 71a are formed in the first direction (a length of the first nozzle 71 from one end of the first opening 71a at one end of the first nozzle 71 to the other end of the first opening 71a at the other end of the first nozzle 71). The length L1 is not limited, but is preferably one third or more, more preferably half or more, of a length L2 of the first chamber 54 in the first direction shown in FIG. 1, from the viewpoint of uniformly supplying nitrogen in the EFEM 50. The first direction, where the first openings 71a are aligned in the first nozzle 71, is preferably a linear direction that is parallel to a horizontal side of the EFEM 50, which is substantially a cuboid, but may be another direction, such as an oblique direction to the sides of the EFEM 50. Incidentally, the first nozzle 71 may have a slit-like first opening formed continuously in the first direction. In this case, a length L1 of the first nozzle 71 in the first direction where the slit-like first opening is formed represents a length from one end to the other end of the slit-like first opening.

As shown in FIG. 1, the second nozzle 72 extends in a parallel direction to the first direction (parallel direction to the X-axis in FIG. 1) and has a plurality of second openings 72a formed intermittently in the parallel direction to the first direction. The second nozzle 72 emits a nitrogen gas supplied from the replacement gas supply source 78. The second nozzle 72 of the EFEM 50 is disposed in the second chamber 64 and thereby emits the nitrogen gas into the second chamber 64. The second nozzle 72 is disposed anywhere in the second chamber 64, but is preferably disposed on the ceiling of the second chamber 64 or near the first communication section 58 connecting the second chamber 64 and the first chamber 54.

The second nozzle 72 is formed to extend in the parallel direction to the first direction, but there is no limit to a length L3 of the second nozzle 72 where the second openings 72a are formed in the parallel direction (a length of the second nozzle 72 from one end of the second opening 72a at one end of the second nozzle 72 to the other end the second opening 72a at the other end of the second nozzle 72). For example, the length L3 of the second nozzle 72, where the second openings 72a are formed, is preferably one third or more, more preferably half or more, of a length L4 of a second progress section 64a of the second chamber 64 in the parallel direction to the first direction, from the viewpoint of uniformly supplying nitrogen in the second chamber 64. Incidentally, the second nozzle 72 may have a slit-like second opening formed continuously in the parallel direction to the first direction. In this case, a length L3 of the second nozzle 72 in the parallel direction to the first direction where the slit-like second opening is formed represents a length from one end to the other end of the slit-like second opening.

Figure 2B:
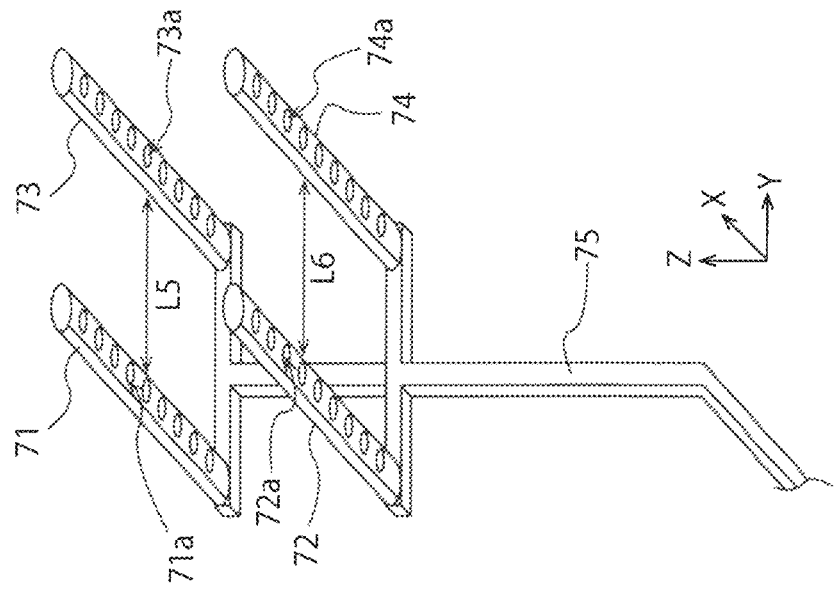
FIG. 2B is a schematic view showing first to fourth nozzles according to a variation of the present invention.

As shown in FIG. 2A and FIG. 2B, the EFEM 50 includes the third nozzle 73 disposed in the first chamber 53 similarly to the first nozzle 71 and the fourth nozzle 74 disposed in the second chamber 64 similarly to the second nozzle 72. The third nozzle 73 is disposed in parallel to the first nozzle 71 at the same height thereas and is disposed with a predetermined distance L5 against the first nozzle 71 in a perpendicular direction to the first direction (parallel direction to the Y-axis). The third nozzle 73 extends in the parallel direction to the first direction (parallel direction to the X-axis in FIG. 1) and has a plurality of third openings 73a formed intermittently in the parallel direction to the first direction.

The third nozzle 73 is formed in the parallel direction to the first direction, but a length of the third nozzle 73 where the third openings 73a are aligned in the parallel direction is similar to the length L1, where the first openings 71a are formed. The distance L5 between the first nozzle 71 and the third nozzle 73 is not limited, but is preferably one third or more, more preferably half or more, of a length of the first chamber 54 in a perpendicular direction to the first direction (parallel direction to the Y-axis), from the viewpoint of uniformly supplying nitrogen in the EFEM 50. The third nozzle 73 may also have a slit-like third opening formed continuously in the parallel direction to the first direction.

As shown in FIG. 2, the fourth nozzle 74 is disposed in parallel to the second nozzle 72 at the same height thereas and is disposed with a predetermined distance L6 against the second nozzle 72 in a perpendicular direction to the parallel direction to the first direction (parallel direction to the Y-axis). The fourth nozzle 74 extends in the parallel direction to the first direction (parallel direction to the X-axis in FIG. 1) and has a plurality of fourth openings 74a formed intermittently in the parallel direction to the first direction.

The fourth nozzle 74 is formed in the parallel direction to the first direction, but a length of the fourth nozzle 74 where the fourth openings 74a are formed in the parallel direction is similar to the length L3, where the second openings 72a are formed. A distance L6 between the second nozzle 72 and the fourth nozzle 74 is not limited, but is preferably one third or more, more preferably half or more, of a length of the second progress section 64a of the second chamber 64 in a perpendicular direction to the parallel direction to the first direction (parallel direction to the Y-axis), from the viewpoint of uniformly supplying nitrogen in the EFEM 50. The fourth nozzle 74 may also have a slit-like fourth opening formed continuously in the parallel direction to the first direction.

As shown in FIG. 1, the first chamber 54 is connected with the upper part of the second chamber 64 and disposed right above the second chamber 64. The first chamber 54 has any size. In an example of FIG. 1, the height of the first chamber 54 is smaller than that of the second chamber 64 disposed below the first chamber 54, and the projection area of the first chamber 54 from above is the same as that of the second chamber 64 disposed below the first chamber 54. When the first chamber 54 has a space that is smaller than a space of the second chamber 64, the replacement gas and the dry air can efficiently be supplied to the filter 62, and the EFEM 50 can be prevented from being larger.

As shown in FIG. 1, the second chamber 64 is connected with the lower part of the first chamber 54. The second chamber 64 includes the oxygen densitometer 66 configured to measure an oxygen concentration of the second chamber 64. Moreover, the second chamber 64 may include other measuring devices, such as a pressure indicator, and may include an openable door (not shown) allowing a person to go in and out during maintenance or so.

As shown in FIG. 1, the second chamber 64 includes a second progress section 64a and a second regress section 64b. The second progress section 64a is a region where the wafers or so are transported. The second regress section 64b is formed by a return duct. The second progress section 64a and the second regress section 64b are horizontally arranged next to each other, and both of the second progress section 64a and the second regress section 64b are connected with the lower part of the first chamber 54. The second progress section 64a and the second regress section 64b are divided by an intermediate wall 69 extending downward from the ceiling of the second chamber 64. A lower communication section 67 connecting lower parts of the second progress section 64a and the second regress section 64b is formed below the intermediate wall 69. The second regress section 64b is communicated with the second progress section 64a via the lower communication section 67.

During formation of the circulating airflow as shown in FIG. 1, a downward airflow is generated in the second progress section 64a of the second chamber 64, and an upward airflow is generated in the second regress section 64b of the second chamber 64. The first chamber 54 includes a first progress section 54a connected with the upper part of the second progress section 64a and a first regress section 54b connected with the upper part of the second regress section 64b. As shown by the arrows 90 of FIG. 1, the circulating airflow circulates in the first chamber 54 and the second chamber 64 in the order of the first progress section 54a, the second progress section 64a, the second regress section 64b, the first regress section 54b, the first progress section 54a, . . . .

As shown in FIG. 1, the first chamber 54 and the second chamber 64 are connected via the first communication section 58 and the second communication section 65. In the first communication section 58, an airflow (downward airflow) going from the first chamber 54 to the second chamber 64 is generated during formation of the circulating airflow. The first communication section 58 includes the filter 62 and the airflow formation unit 60 configured to produce the circulating airflow between the first chamber 54 and the second chamber 64.

The airflow formation unit 60 includes a ventilation fan 61 and a drive unit configured to drive the ventilation fan 61. The ventilation fan 61 rotates by receiving controls from a controller (not shown), and the circulating airflow shown in FIG. 1 is produced in the EFEM 50. The airflow formation unit 60 reduces particles floating in the second chamber 64 by generating a downward airflow in the second progress section 64a of the second chamber 64, and it is thereby possible to increase cleanliness of the second progress section 64a of the second chamber 64. Moreover, the airflow formation unit 60 can reduce the consumption of nitrogen gas filled in the EFEM 50 during the normal operation by forming a circulating gas going up in the second regress section 64b of the second chamber 64, returning to the first chamber 54 via the second communication section 65, and returning to the first communication section 58 via the first regress section 54b and the first progress section 54a of the first chamber 54.

The filter 62 increases cleanliness of the EFEM 50 by removing particles and a predetermined component contained in the gas of the first chamber 54 and the second chamber 64. The filter 62 may be any filter, such as a combination of a particle removal filter and a chemical filter. The airflow formation unit 60 and the filter 62 arranged in the first communication section 58 may be a fan filter unit (FFU) formed by integrating the ventilation fan 61 and the filter 62 of the airflow formation unit 60, or the airflow formation unit 60 and the filter 62 may be separate from each other. When the airflow formation unit 60 and the filter 62 are separate from each other, for example, the ventilation fan 61 of the airflow formation unit 60 can be disposed on the ceiling or so of the first chamber 54.

The airflow formation unit 60 is disposed next to the filter 62 in the first communication section 58 of the EFEM 50. Moreover, the first nozzle 71 disposed in the first chamber 54 and the second nozzle 72 disposed in the second chamber 64 are arranged to sandwich the airflow formation unit 60 and the filter 62 in the vertical direction. Since the nozzles 71 and 72 configured to emit a nitrogen gas are arranged to sandwich the airflow formation unit 60 and the filter 62 in the vertical direction, a deviation of concentration of nitrogen gas caused by a ventilation resistance of the filter 62 is hard to occur, and the filter 62 can be prevented from being contaminated by filling nitrogen gas around the filter 62.

As shown in FIG. 1, an airflow (upward airflow) going from the second chamber 64 to the first chamber 54 is generated in the second communication section 65 during formation of the circulating airflow. The second communication section 65 may include a ventilation state switchable unit (not shown) configured to switch a ventilation state of the second communication section 65. For example, the ventilation state switchable unit includes a valve configured to switch a ventilation state of the second communication section 65 between a state where gas is movable from the second chamber 64 to the first chamber 54 via the second communication section 65 and a state where gas is unmovable from the second chamber 64 to the first chamber 54 via the second communication section 65.

The gas discharge port 68 discharges gases from the first chamber 54 or the second chamber 64. The gas discharge port 68 shown in FIG. 1 is connected with the second regress section 64b of the second chamber 64 and discharges gases of the second chamber 64 therefrom. Discharged from the gas discharge port 68 are an air used to exist in the EFEM 50 before introducing nitrogen gas, a nitrogen gas introduced into the EFEM 50 via the first to fourth nozzles 71 to 74, an air in the factory flowed from the openable door or so into the EFEM 50 during maintenance, and the like. When the circulating airflow shown in FIG. 1 is formed, the gases may not be discharged from the gas discharge port 68, and an amount of gases corresponding to an amount of gas supplied from the first to fourth nozzles 71 to 74 may be discharged from the gas discharge port 68.

The gas discharge port 68 is connected with the second chamber 64 at a position that is lower than the second openings 72a and the fourth openings 74a. In the EFEM 50, the gases of the second chamber 64 are discharged from the gas discharge port 68 disposed at a low position, but the gas discharge port 68 may be connected with the second chamber 64 or the first chamber 54 in the vicinity of the second communication section 65. The gas discharge port 68 of the present embodiment is a natural exhaust mechanism having no means of ventilation like a fan, but the gas discharge port 68 of the present invention may be a forced discharge mechanism having a means of ventilation.

Figure 6:
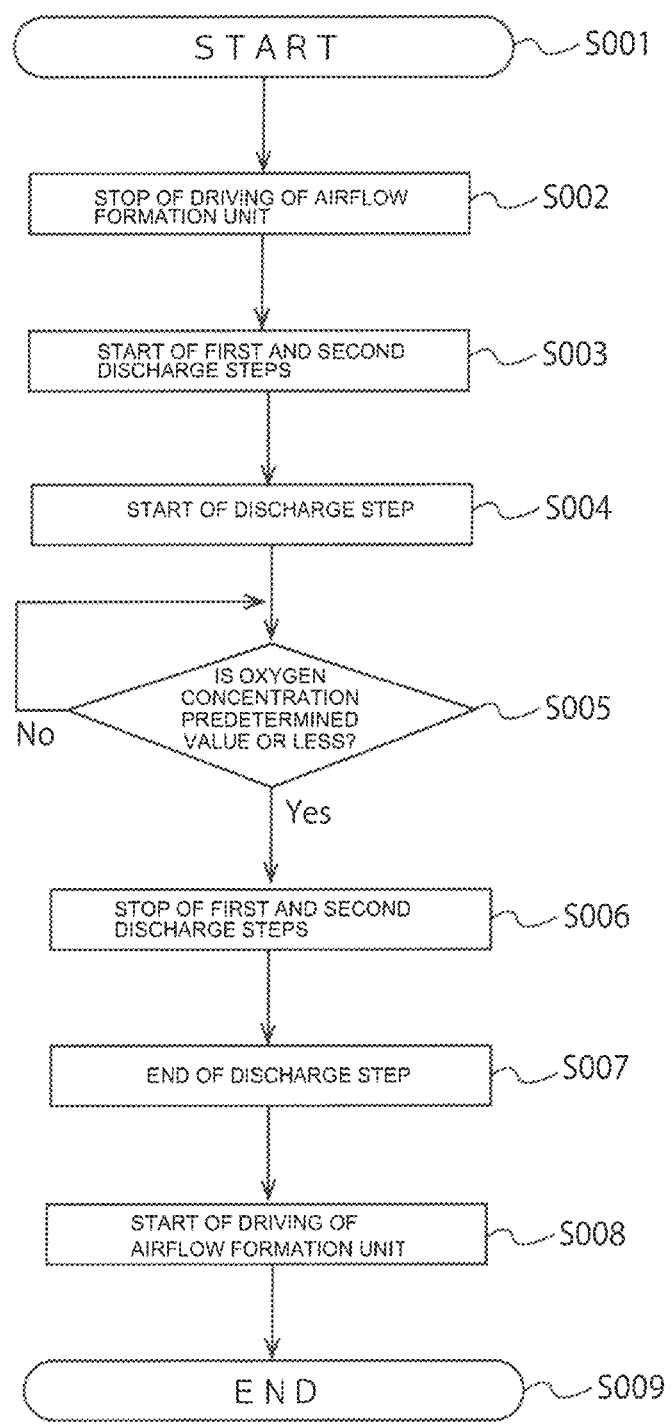
FIG. 6 is a flowchart showing a method of introducing a nitrogen gas into the EFEM shown in FIG. 1.

FIG. 6 is a flowchart showing a method of gas replacement in the EFEM 50 shown in FIG. 1. In Step S001, a series of gas replacement shown in FIG. 6 begins. The gas replacement of the EFEM 50 is carried out, for example, before the beginning of the normal operation of the EFEM 50, or after the end of maintenance of the EFEM 50 and before the restart of the normal operation of the EFEM 50. The first chamber 54 and the second chamber 64 of the EFEM 50 are filled with air before the beginning of the gas replacement of the EFEM 50 shown in FIG. 2.

In Step S002 of FIG. 6, carried out is an airflow adjustment step where adjusted is a driving of the airflow formation unit 60 configured to produce a circulating airflow between the first chamber 54 and the second chamber 64 shown in FIG. 1. Specifically, when a controller (not shown) stops the driving of the airflow formation unit 60, the ventilation fan 61 of the airflow formation unit 60 stops rotating and stops producing a circulating airflow.

In Step S003 of FIG. 6, started are a first emission step where a nitrogen gas is emitted into the EFEM 50 using the first nozzle 71 shown in FIG. 1 and a second emission step where a nitrogen gas is emitted into the EFEM 50 using the second nozzle 72 shown in FIG. 1. In the first emission step, a nitrogen gas supplied from the replacement gas supply source 78 is emitted from the first openings 71a into the first chamber 54. In the first emission step, a nitrogen gas is emitted not only from the first openings 71a of the first nozzle 71 but from the third openings 73a of the third nozzle 73 (see FIG. 2) into the first chamber 54.

In the second emission step, a nitrogen gas supplied from the replacement gas supply source 78 is emitted from the second openings 72a into the second chamber 64. In the second emission step, a nitrogen gas is emitted not only from the second openings 72a of the second nozzle 72 but from the fourth openings 74a of the fourth nozzle 74 (see FIG. 2) into the second chamber 64.

In the method of gas replacement shown in FIG. 6, the first emission step and the second emission step are carried out at the same time, but may be started or finished at different timings, or either of the first emission step and the second emission step may be carried out intermittently.

In Step S004 of FIG. 6, started is a discharge step where gases of the second chamber 64 are discharged therefrom. A nitrogen gas is introduced into the EFEM 50 by the beginning of the first and second emission steps, gases of the EFEM 50 are thereby partially flowed into the gas discharge port 68, and the discharge step is started along with the beginning of the first and second emission steps. In an EFEM where a gas discharge port 68 is connected with a first chamber 54, gases are emitted from the first chamber 54 in the discharge step.

In Step S005 of FIG. 6, an oxygen concentration of the EFEM 50 (second chamber 64) is measured using the oxygen densitometer 66 of the second chamber 64, and confirmed is whether an oxygen concentration of the EFEM 50 is a predetermined value or less. In Step S005, the first and second emission steps are continued if a measured oxygen concentration of the EFEM 50 exceeds a predetermined value. On the other hand, if a measured oxygen concentration of the EFEM 50 is a predetermined value or less in Step S005, Step S006 begins, and the first and second emission steps are stopped.

In Step S006 of FIG. 6, the first and second emission steps started in Step S003 are stopped. In Step S006, the emission of nitrogen gas into the EFEM 50 is stopped by stopping all of the discharges of nitrogen gas from the first to fourth openings 71a to 74a shown in FIG. 1 and FIG. 2. In Step S006, however, the emission of nitrogen gas may not completely be stopped as mentioned above, but an emission amount of nitrogen gas from the first to fourth openings 71a to 74a may be reduced. In this case, the emission of nitrogen gas from some of the first to fourth nozzles 71 to 74 may be continued and the emission of nitrogen gas from the other nozzles may be stopped, or an emission amount of nitrogen gas from the first to fourth openings 71a to 74a may be reduced as a whole.

In Step S007 of FIG. 6, the discharge step started in Step S004 is stopped. If all of the discharges of nitrogen gas are stopped in Step S006, the emission of gas from the gas discharge port 68 shown in FIG. 1 is preferably also completely stopped. If an emission amount (per unit time) of nitrogen gas from the first to fourth openings 71a to 74a is reduced in Step S006, however, a discharge amount (per unit time) from the gas discharge port 68 may be reduced in Step S007.

In Step S008 of FIG. 6, started (restarted) is a driving of the airflow formation unit 60 configured to produce a circulating airflow between the first chamber 54 and the second chamber 64 shown in FIG. 1. Specifically, when a controller (not shown) starts (restarts) the driving of the airflow formation unit 60, the ventilation fan 61 of the airflow formation unit 60 rotates, and the ventilation fan 61 produces a circulating airflow.

In Step S009, the series of gas replacement in the EFEM 50 is finished. After the gas replacement shown in FIG. 6 is finished, the EFEM 50 can carry out a normal operation where wafers are transported in the second chamber 64.

As described above, the EFEM 50 having the first and second nozzles 71 and 72 shown in FIG. 1 can emit a replacement gas from both of the first and second nozzles 71 and 72. Since the first and second openings 71a and 72a of the first and second nozzles 71 and 72 are formed intermittently or continuously in the first direction or the parallel direction thereto, the EFEM 50 having the nozzles 71 and 72 can arrange the openings 71a and 72a configured to discharge the replacement gas in a wide range of the EFEM 50 and can increase a concentration of the replacement gas of the first and second chambers 54 and 64 of the EFEM 50 more uniformly and efficiently than before. Since the third and fourth nozzles 73 and 74 are used in addition to the first and second nozzles 71 and 72, it is possible to efficiently increase a concentration of nitrogen gas in the first and second chambers 54 and 64 of the EFEM 50 and to reduce the time for gas replacement.

Since the EFEM 50 has not only the first nozzle 71 configured to emit the replacement gas into the first chamber 54 but the second nozzle 72 configured to emit the replacement gas into the second chamber 64, it is possible to increase a concentration of the replacement gas in the first and second chambers 54 and 64 of the EFEM 50 more uniformly than before. For example, the EFEM 50 shown in FIG. 1 can also effectively lead a nitrogen gas to the corners of the second chamber 64, where the airflow from the first communication section 58 with the filter 62 is hard to reach, using the second nozzle 72. Thus, the EFEM 50 can increase a concentration of nitrogen gas of the second chamber 64 more efficiently than before and reduce the time for gas replacement.

Figure 7:
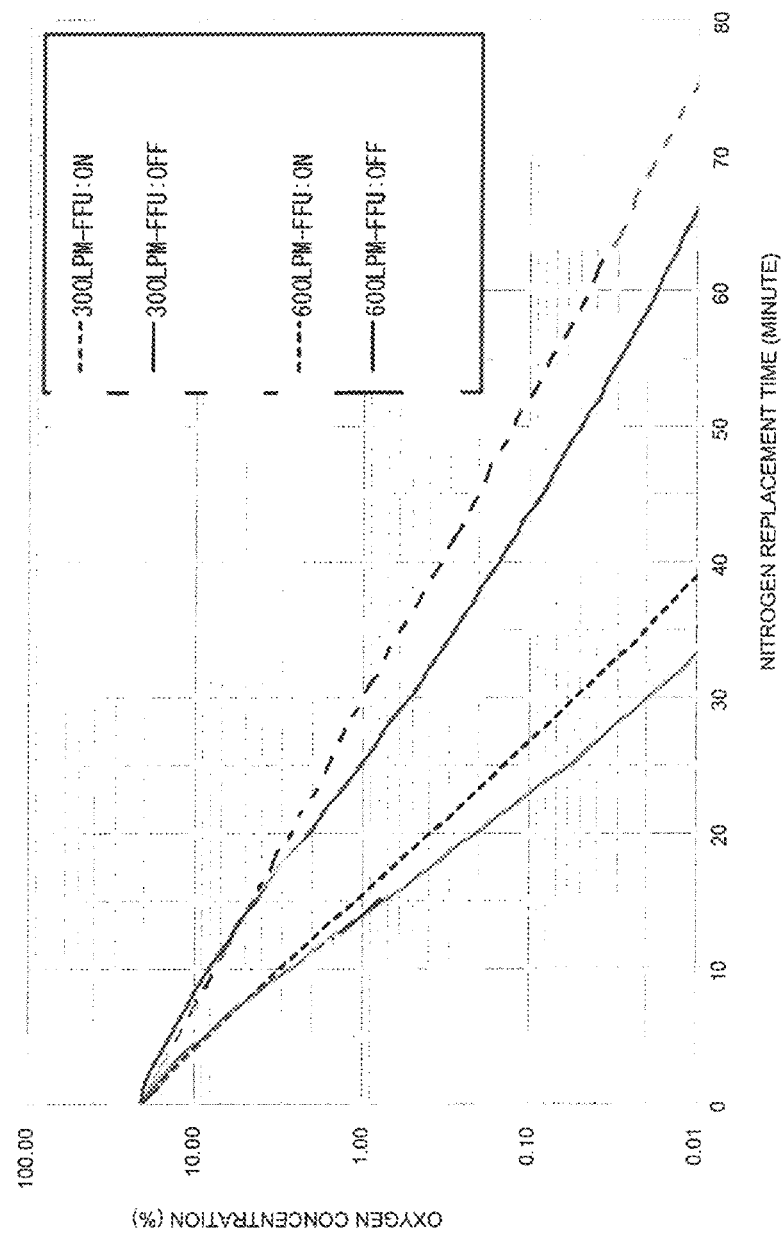
FIG. 7 is a graph showing decrease in oxygen concentration caused by replacement with nitrogen gas in the EFEM shown in FIG. 1.

In the EFEM 50, since the nitrogen gas is emitted while the airflow formation unit 60 is not being driven as shown in the method of FIG. 6, a concentration of nitrogen gas of the second chamber 64 can increase in a short time, compared to when the nitrogen gas is emitted while the airflow formation unit 60 is continuously being driven. FIG. 7 is a graph showing a relation of gas emission time and decrease in oxygen concentration in the EFEM 50 between a case where a gas replacement is carried out in the EFEM 50 while the airflow formation unit 60 is not being driven and a case where a gas replacement is carried out in the EFEM 50 while the airflow formation unit 60 is continuously being driven.

In FIG. 7, the broken line (emission amount: 300 liters/minute) and the narrower broken line (emission amount: 600 liters/minute) represent a result of gas replacement while the airflow formation unit 60 is continuously being driven. On the other hand, the solid line (emission amount: 300 liters/minute) and the narrower solid line (emission amount: 600 liters/minute) represent a result of gas replacement while the airflow formation unit 60 is not being driven. In the gas replacement of the EFEM 50, FIG. 7 shows that if the gas emission amount from the nozzles is the common, the oxygen concentration can more quickly reach a predetermined concentration that is lower than 1% in the case where the gas replacement is carried out while the airflow formation unit 60 is not being driven. This is probably because the discharge efficiency of oxygen is decreased by mixture of the introduced nitrogen and the air containing oxygen if gas is emitted while the airflow formation unit 60 is continuously being driven, but this problem can be prevented and the air containing oxygen can efficiently be discharged if the gas replacement is carried out while the airflow formation unit 60 is not being driven.

The EFEM 50 has a plurality of first to fourth nozzles 71 to 74 and can emit a nitrogen gas in a wide range of the EFEM 50, and it is thereby considered that the nitrogen gas can uniformly be spread in the EFEM 50 even if the gas replacement is carried out while the airflow formation unit 60 is not being driven, and that the gas replacement can efficiently be carried out.

The present invention is accordingly described based on First Embodiment, but is not limited thereto and, needless to say, includes many other embodiments and variations. For example, FIG. 3A and FIG. 3B are a schematic view showing first and second nozzles 271 and 272 and pipes 275 and 375 connecting the first and second nozzles 271 and 272 in an EFEM according to Second Embodiment, and FIG. 3A and FIG. 3B correspond to FIG. 2A and FIG. 2B of the EFEM 50 according to First Embodiment.

The first nozzle 271 of the EFEM according to Second Embodiment has a plurality (four or more) of first openings 271a arranged on a plane in the X-axis and the Y-axis, which are two horizontal directions. Moreover, the second nozzle 272 of the EFEM according to Second Embodiment also has a plurality (four or more) of second openings 272a arranged on a plane in the X-axis and the Y-axis, which are two horizontal directions. The first nozzle 271 is disposed in the first chamber 54 located above, and the second nozzle 272 is disposed in the second chamber 64 located below.

The pipes 275 and 375 connecting between the first and second nozzles 271 and 272 and the replacement gas supply source 78 (see FIG. 1) have any shape. As shown in FIG. 3A, the pipe 275 may have a width in the Y-axis direction that is equal to a width of the first and second nozzles 271 and 272 in the Y-axis direction. As shown in FIG. 3B, the pipe 375 may have a width in the Y-axis direction that is smaller than a width of the first and second nozzles 271 and 272 in the Y-axis direction. The EFEM according to Second Embodiment including the first and second nozzles 271 and 272 demonstrates effects similar to those of the EFEM 50 according to First Embodiment.

Figure 4:
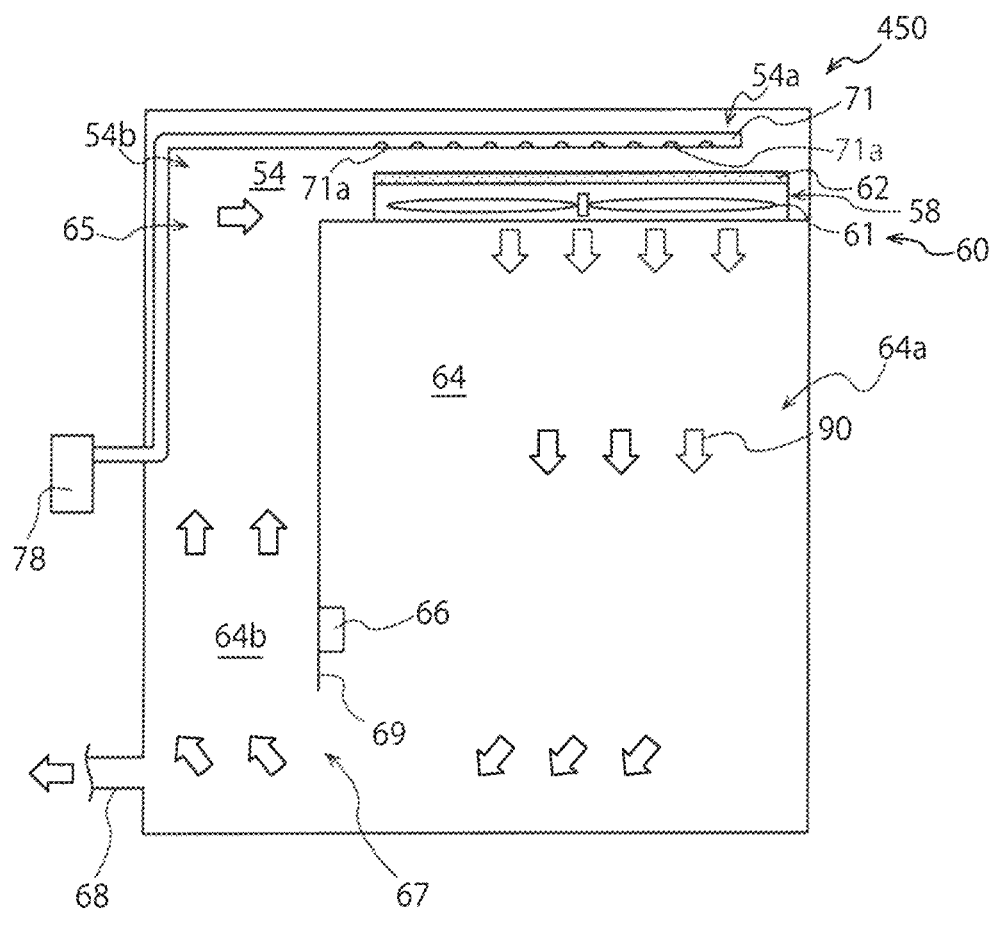
FIG. 4 is a schematic view showing a flow of a replacement gas in an EFEM according to Third Embodiment of the present invention.

FIG. 4 is a schematic view of an EFEM 450 according to Third Embodiment of the present invention showing the first nozzle 71 and a second nozzle 472 of the EFEM 450. The EFEM 450 is similar to the EFEM 50 except that both of the first and second nozzles 71 and 472 are arranged in the first chamber 54, and that the EFEM 450 does not have a nozzle configured to emit nitrogen in the second chamber 64 like the second nozzle 72 or the fourth nozzle 74 shown in FIG. 1. In the description of the EFEM 450, only differences from the EFEM 50 are described, and common matters with the EFEM 50 are provided with similar references and not described.

Figure 5:
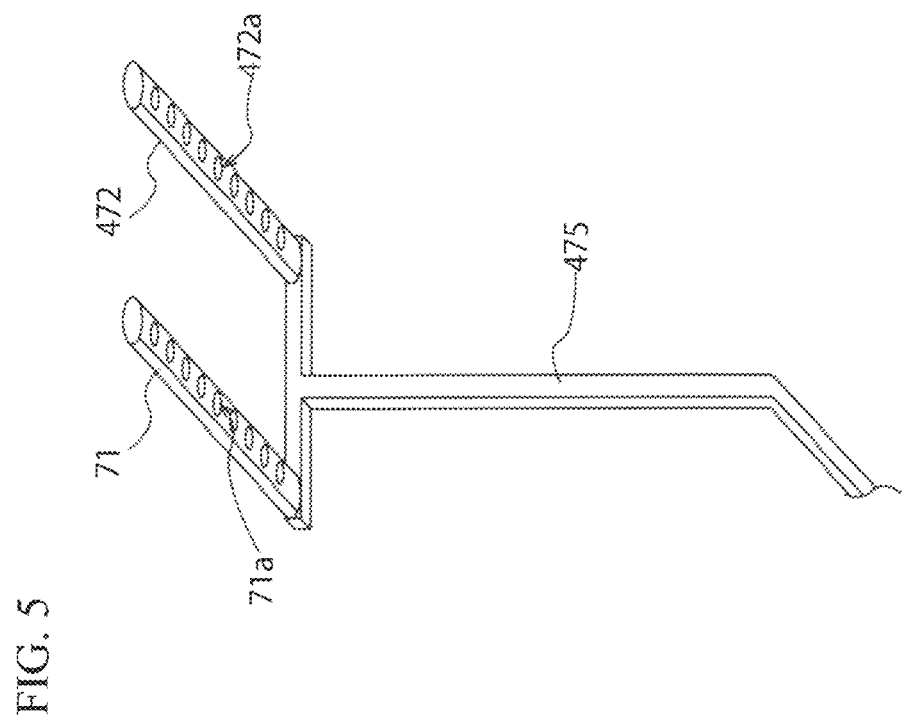
FIG. 5 is a schematic view showing first and second nozzles of the EFEM shown in FIG. 4.

As shown in FIG. 5, the second nozzle 472 of the EFEM 450 extends in a parallel direction to the first direction (parallel direction to the X-axis in FIG. 1) and has a plurality of second openings 472a formed intermittently in the parallel direction to the first direction. The first nozzle 71 and the second nozzle 472 are connected with the replacement gas supply source 78 via a pipe 475. Similarly to the first nozzle 71, the second nozzle 472 emits a nitrogen gas supplied from the replacement gas supply source 78 from the second openings 472a. The second nozzle 472 is disposed in the first chamber 54 at the same height as the first nozzle 71 and emits the nitrogen gas into the first chamber 54.

Similarly to the EFEM 50 according to First Embodiment, openings 71a and 472a configured to discharge a replacement gas can be arranged in a wide range of the first chamber 54 of the EFEM 450 according to Third Embodiment, and a concentration of the replacement gas in the EFEM 450 can increase more uniformly and efficiently than before.

The gas replacement described in the embodiments can be carried out not only when the normal operation is restarted from maintenance or so, but carried out during the normal operation when a concentration of nitrogen in the second chamber 64 is desired to increase during the normal operation.

NUMERICAL REFERENCES 50, 450 . . . EFEM
54 . . . first chamber
54a . . . first progress section
54b . . . first regress section
58 . . . first communication section 60 . . . airflow formation unit
61 . . . ventilation fan
62 . . . filter
64 . . . second chamber
64a . . . second progress section
64b . . . second regress section
65 . . . second communication section
66 . . . oxygen densitometer
67 . . . lower communication section
68 . . . gas discharge port
69 . . . intermediate wall
71, 271 . . . first nozzle
71a, 271a . . . first opening
72, 272, 472 . . . second nozzle
72a, 272a, 472a . . . second opening
73 . . . third nozzle
73a . . . third opening
74 . . . fourth nozzle
74a . . . fourth opening
75, 175, 275, 375, 475 . . . pipe
78 . . . replacement gas supply source
90 . . . arrow
L1, L2 L3, L4 . . . length
L5, L6 . . . distance

The invention claimed is:

1. An EFEM comprising:
a first chamber configured to introduce a replacement gas;
a second chamber connected with a lower part of the first chamber via:
a first communication section having a filter and configured such that the replacement gas inflows from the first chamber at the time of formation of a circulating airflow; and
a second communication section configured such that the replacement gas outflows into the first chamber at the time of formation of the circulating airflow;
an airflow formation unit configured to produce the circulating airflow between the first chamber and the second chamber;
a gas discharge port configured to discharge an internal gas from the first chamber or the second chamber;
a first nozzle in the first chamber that includes a first opening with a length intermittently or continuously in a first direction that is a horizontal direction and configured to discharge the replacement gas supplied from a replacement gas supply source into the first chamber through the first opening; and
a second nozzle including a second opening with a length intermittently or continuously in a parallel direction to the first direction and configured to discharge the replacement gas supplied from the replacement gas supply source downward through the second opening, wherein:
the first opening opens downward perpendicular to the first direction;
a length of the first nozzle in the first chamber in the first direction is half or more of a length of the first chamber in the first direction;
the second nozzle is in the second chamber and is configured to emit the replacement gas into the second chamber;
the airflow formation unit is next to the filter in the first communication section; and
the airflow formation unit and the filter are right below the first nozzle and right above the second nozzle and overlap the first nozzle and the second nozzle in a vertical direction such that the first nozzle in the first chamber and the second nozzle in the second chamber sandwich the airflow formation unit and the filter in the vertical direction.

2. A method of introducing a replacement gas into an EFEM, comprising:
a first emission step of emitting a replacement gas supplied from a replacement gas supply source into a first chamber through a first opening of a first nozzle in the first chamber, wherein the first opening has a length intermittently or continuously in a first direction that is at least a horizontal direction, the first opening opens downward perpendicular to the first direction and a length of the first nozzle in the first direction is half or more of a length of the first chamber in the first direction;
a second emission step of emitting the replacement gas downward into the second chamber through a second opening of a second nozzle, wherein the second nozzle is in the second chamber and the second opening has a length intermittently or continuously in a parallel direction to the first direction;
a discharge step of discharging an internal gas from the first chamber or a second chamber, wherein the second chamber is connected with a lower part of the first chamber via:
a first communication section having a filter and configured such that replacement gas inflows from the first chamber at the time of formation of a circulating airflow; and
a second communication section where the replacement gas outflows into the first chamber at the time of formation of the circulating airflow; and
an airflow adjustment step of adjusting a driving of an airflow formation unit configured to produce the circulating airflow between the first chamber and the second chamber, wherein the airflow formation unit is next to the filter in the first communication section, and the airflow formation unit and the filter are right below the first nozzle and right above the second nozzle and overlap the first nozzle and the second nozzle in a vertical direction such that the first nozzle in the first chamber and the second nozzle in the second chamber sandwich the airflow formation unit and the filter in the vertical direction.

3. The method according to claim 2, wherein the first emission step and the second emission step are carried out while the airflow formation unit is not being driven in the airflow adjustment step.

* * * * *